United States Patent
Kishi et al.

(10) Patent No.: US 10,504,957 B2
(45) Date of Patent: Dec. 10, 2019

(54) SEMICONDUCTOR DEVICE WITH HALL ELEMENTS AND MAGNETIC FLUX CONCENTRATOR

(71) Applicant: SII Semiconductor Corporation, Chiba-shi, Chiba (JP)

(72) Inventors: Matsuo Kishi, Chiba (JP); Miei Takahama (nee Sato), Chiba (JP); Hiroshi Takahashi, Chiba (JP); Mika Ebihara, Chiba (JP); Takaaki Hioka, Chiba (JP)

(73) Assignee: ABLIC Inc. (JP)

( * ) Notice: Subject to any disclaimer, the term of this patent is extended or adjusted under 35 U.S.C. 154(b) by 0 days.

(21) Appl. No.: 15/457,346

(22) Filed: Mar. 13, 2017

(65) Prior Publication Data
US 2017/0271401 A1    Sep. 21, 2017

(30) Foreign Application Priority Data
Mar. 15, 2016  (JP) .................................. 2016-051495

(51) Int. Cl.
| | |
|---|---|
| *H01L 27/22* | (2006.01) |
| *G01R 33/07* | (2006.01) |
| *H01L 43/04* | (2006.01) |
| *H01L 43/06* | (2006.01) |
| *H01L 43/10* | (2006.01) |
| *H01L 43/14* | (2006.01) |

(52) U.S. Cl.
CPC .............. *H01L 27/22* (2013.01); *G01R 33/07* (2013.01); *H01L 43/04* (2013.01); *H01L 43/06* (2013.01); *H01L 43/10* (2013.01); *H01L 43/14* (2013.01)

(58) Field of Classification Search
CPC ......... H01L 27/22; H01L 43/04; H01L 43/06; H01L 43/065; H01L 43/10; H01L 43/12; H01L 43/14; G01R 33/0052; G01R 33/07; G01R 33/077
See application file for complete search history.

(56) References Cited

U.S. PATENT DOCUMENTS

| | | | | |
|---|---|---|---|---|
| 2009/0309590 A1* | 12/2009 | Kataoka | ............. | G01R 33/0011 324/244 |
| 2014/0252514 A1* | 9/2014 | Kim | ............. | H01L 43/065 257/421 |

OTHER PUBLICATIONS

Abstract, Publication No. JP 2002-071381, Publication date Mar. 8, 2002.

(Continued)

*Primary Examiner* — Matthew C Landau
*Assistant Examiner* — Mark Hatzilambrou
(74) *Attorney, Agent, or Firm* — Adams & Wilks

(57) ABSTRACT

A semiconductor device includes a semiconductor substrate having a plurality of Hall elements formed therein, and a magnetic body formed on the semiconductor substrate and having a magnetic flux converging function. The contour in a vertical cross section of the magnetic body on the semiconductor substrate has an outer circumferential portion. At least a part of the outer circumferential portion has a curve-shaped portion and a portion substantially parallel to the semiconductor substrate. A gap is formed between the semiconductor substrate and the portion of the magnetic body that is substantially parallel to the semiconductor substrate, and the gap lies above the entire top surfaces of the Hall elements. The magnetic body has at least a part of a structure made of non-magnetic substance embedded therein.

14 Claims, 8 Drawing Sheets

(56) References Cited

OTHER PUBLICATIONS

Abstract, Publication No. WO 2007-119569, Publication date Oct. 25, 2007.
Abstract, Publication No. JP 2008-055663, Publication date Mar. 13, 2008.

* cited by examiner (a)

(b)

SEMICONDUCTOR DEVICE WITH HALL ELEMENTS AND MAGNETIC FLUX CONCENTRATOR

BACKGROUND OF THE INVENTION

1. Field of the Invention

The present invention relates to a semiconductor device configured to detect magnetism, and a method of manufacturing the semiconductor device. More particularly, the present invention relates to a semiconductor device capable of detecting magnetism in two-dimensional or three-dimensional directions with high sensitivity by including a plurality of Hall elements and a magnetic body that is configured to converge magnetic fluxes passing near the semiconductor device, and to a method of manufacturing the semiconductor device.

2. Description of the Related Art

Semiconductor devices configured to detect magnetism by the Hall effect have been known for years, and semiconductor devices that combine a Hall element with a magnetic body have also been made in order to enhance sensitivity and performance and detect magnetism in two-dimensional or three-dimensional directions.

For instance, in a magnetic field direction sensor utilizing the Hall effect that is described in Japanese Patent Application Laid-open No. 2002-71381, a plurality of Hall elements are arranged and a magnetic flux converging plate having a flat shape and made from a soft-magnetic material is arranged above a region of the plurality of Hall elements.

In the magnetic field direction sensor, an edge portion of the magnetic flux converging plate is located in the Hall element region, and magnetic fluxes converged by the magnetic flux converging plate accordingly concentrate in a direction perpendicular to the Hall elements in the vicinity of surfaces of the Hall elements. This makes the density of magnetic fluxes passing the Hall elements high, thereby enhancing the sensitivity of detecting the magnetic fluxes. This further enables the magnetic field direction sensor to calculate magnetic flux directions and the magnetic flux intensity in each magnetic flux direction by detecting and calculating for each of the plurality of Hall elements the intensity of a magnetic flux that passes the Hall element. A magnetic flux direction relative to the magnetic field direction sensor can thus be broken into coordinate axes that have the magnetic field direction sensor as the reference. A marked improvement in performance from a magnetic sensor that simply uses a Hall element can be expected as a result.

A magnetic sensor utilizing the Hall effect that is described in International Patent WO2007/119569 is based on a structure and principle similar to those of Japanese Patent Application Laid-open No. 2002-71381. Stress generated between the magnetic flux converging plate and a semiconductor substrate on which the magnetic flux converging plate is mounted due to the difference in material, in particular, stress due to the difference in thermal expansion influences sensor characteristics significantly. The magnetic sensor has thus a structure for reducing the influence.

The magnetic sensor achieves this goal by employing a structure in which a base layer is formed between the magnetic flux converging plate and the semiconductor substrate, a portion of the base layer that is connected to the semiconductor substrate is smaller in area than the magnetic flux converging plate, and the base layer at least partially covers the Hall element region.

The magnetic sensor utilizing the Hall effect that is described in International Patent WO2007/119569 also regulates the shape in vertical cross-section of the magnetic flux converging plate, to thereby improve its performance.

FIG. 8A to FIG. 8C are diagrams for illustrating, as a magnetic sensor of the related art, the magnetic sensor that is described in International Patent WO 2007/119569. A main portion of the magnetic sensor is illustrated in vertical cross-section in FIG. 8A to FIG. 8C.

In the magnetic sensor illustrated in FIG. 8A, the base layer is smaller in area than the magnetic flux converging plate. Hall elements 102a and 102b are formed and embedded near one surface of a semiconductor substrate 101a. An insulating protective layer 103 is formed on surfaces of the Hall elements 102a and 102b. A base layer 104 is formed on a surface of the insulating protective layer 103 so as to cover the Hall elements 102a and 102b. A magnetic flux converging plate 105a is further formed on top of the base layer 104 from a magnetic material so as to be larger in area than the base layer 104.

Structures illustrated in FIG. 8B and FIG. 8C are tapered in a straight line in end surface directions of magnetic flux converging plates 105b and 105c.

However, when the base layer or the magnetic flux converging plate is directly connected to the Hall element region, stress is generated on the Hall element region, which is obviously undesirable. Thus, formation of the base layer, the magnetic flux converging plate, or other similar structures on the Hall element region is required to be avoided for that reason, and for the improvement of element performance as well.

In addition, the tapered structures of FIG. 8B and FIG. 8C do not exactly have a curvature that is preferred in order to converge magnetic fluxes efficiently and vertically to the Hall element region surface, which is formed in a direction parallel to the semiconductor substrate (planar direction). In a structure having the preferred curvature, an end surface of the magnetic flux converging plate faces the direction of the Hall elements, and a magnetic flux passing through a portion of the magnetic flux converging plate that is parallel to the semiconductor substrate is efficiently deflected in a direction perpendicular to the semiconductor substrate.

A magnetic sensor that includes a magnetic flux converging plate is fabricated by, as described in International Patent WO2007/119569 and Japanese Patent Application Laid-open No. 2008-55663, photolithography, vapor plating, and electrolytic plating. Shape regulation using a mold for electrolytic plating with a photoresist is employed as a method of forming the magnetic flux converging plates 105b and 105c, which are tapered in a straight line.

Another known method combines photolithography and electrolytic plating to form a plated object that has an approximate quadrant shape (see Japanese Patent Application Laid-open No. 2008-55663, for example).

According to this method, a structure having a curved surface that has an approximate quadrant shape in section can be formed by electrolytic plating.

It is not preferred to mount a base layer, a magnetic flux converging plate, or other similar structures on the Hall element region as described above, and there has been no effective measure to form a magnetic flux converging plate right above the Hall element region without constructing a structure directly on the Hall element region.

There has also been a demand for a magnetic flux converging plate that has a more suitable structure for deflecting a magnetic flux vertically to the Hall element region, and for a method of manufacturing the magnetic flux converging plate.

SUMMARY OF THE INVENTION

The present invention has been made in view of the circumstances described above, and an object of the present invention is to provide a semiconductor device that includes a magnetic sensor installed with a Hall element that has a minute structure made by a semiconductor manufacturing technology and with a magnetic flux converging plate that has an end surface structure through which a magnetic flux can pass efficiently and vertically to a Hall element region surface, and a method of manufacturing the semiconductor device.

To attain this object, the present invention employs the following measures.

According to one embodiment of the present invention, there is provided a semiconductor device, comprising:

a semiconductor substrate having a plurality of Hall elements formed therein;

a magnetic body formed on the semiconductor substrate and having a magnetic flux converging function, the magnetic body having a contour in vertical-cross section that is defined by an outer circumferential portion, and at least a part of the outer circumferential portion comprises a curve-shaped portion and a portion substantially parallel to the semiconductor substrate; and a structure made of non-magnetic substance at least a part of which is embedded in the magnetic body.

According to one embodiment of the present invention, there is provided A method of manufacturing a semiconductor device, comprising:

forming a plurality of Hall elements on a surface of a semiconductor substrate;

forming a protective layer from an insulator on the plurality of Hall elements;

forming a structure from non-magnetic substance on the protective layer; and covering the non-magnetic substance with a magnetic body formed on the semiconductor substrate and having a magnetic flux converging function.

According to the present invention, the semiconductor device that is installed with a magnetic flux converging plate configured to detect magnetism in two-dimensional or three-dimensional directions with high sensitivity can be provided.

DESCRIPTION OF THE EMBODIMENTS

An embodiment of the present invention is described with reference to FIG. 1A to FIG. 5B.

Figure 1A:
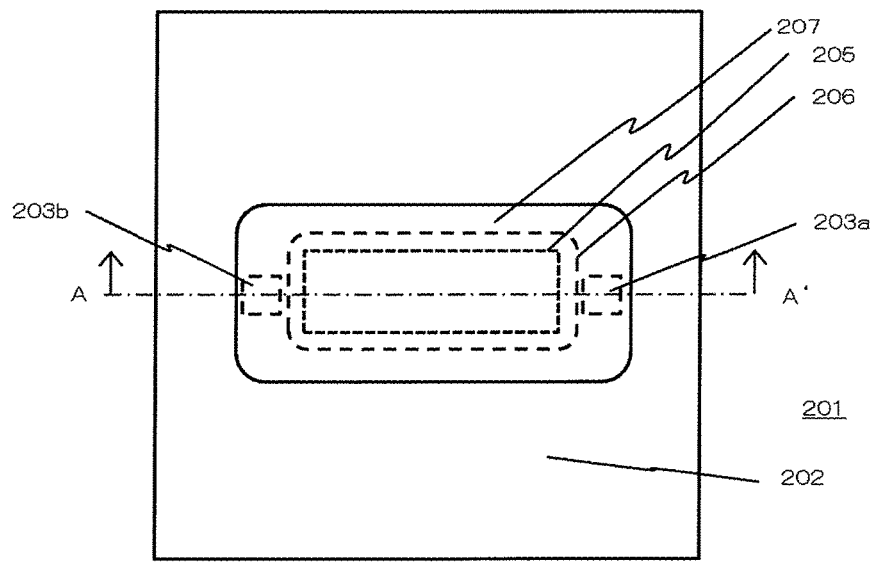
FIG. 1A and FIG. 1B are a top view and a cross-sectional view for illustrating a main portion of a semiconductor device according to an embodiment of the present invention.
Figure 1B:
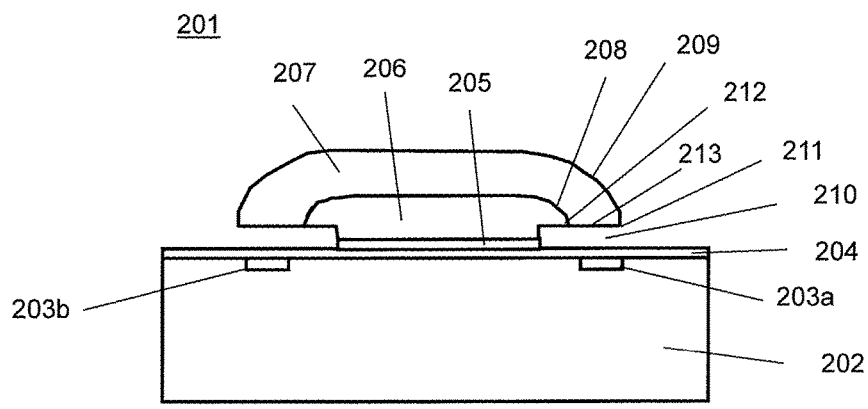

FIG. 1A is a schematic top view of a surface of a semiconductor device according to the present invention. FIG. 1B is a schematic vertical cross-sectional view taken along the line A-A' of FIG. 1A.

A semiconductor device 201 includes two Hall elements 203a and 203b, which are formed in a surface of a semiconductor substrate 202 made of silicon, an insulating protective layer 204, which is formed on the Hall elements 203a and 203b, a base layer 205, which is made of metal, a non-magnetic structure 206, and a magnetic body 207, which is to serve as a magnetic flux converging plate. The Hall elements 203a and 203b, the non-magnetic structure 206, and the magnetic body 207 are positioned in a symmetric pattern as illustrated in FIG. 1A.

As illustrated in the vertical cross-sectional view of FIG. 1B, a part of a contact surface between the non-magnetic structure 206 and the magnetic body 207 and a part of an outer circumferential portion that defines the contour in vertical-cross section of the magnetic body 207 have approximate quadrant portions 208 and 209, respectively, which are curve-shaped.

The base layer 205 is not in direct contact with the top surfaces of the Hall elements 203a and 203b because of the protective layer 204 interposed between the base layer 205 and the Hall elements 203a and 203b. The non-magnetic structure 206 and the magnetic body 207 are not in contact with the protective layer 204. A gap 210 separates the non-magnetic structure 206 and the magnetic body 207 from the protective layer 204 in a portion near the top surfaces of the Hall elements 203a and 203b.

The magnetic body 207 has a bottom portion 213 that is between an edge portion 211 of the approximate quadrant portion 209 of the magnetic body 207 and an edge portion 212 of the approximate quadrant portion 208 of the non-magnetic structure 206 is parallel to the surface of the Hall element 203a. The bottom portion 213 has a size and a positional relationship that allow the bottom portion 213 to cover the Hall element 203a completely in a top view.

Steps for manufacturing this semiconductor device 201 are described with reference to FIG. 2A to FIG. 5B, by focusing on a portion that corresponds to the main portion illustrated in the vertical cross-sectional view of FIG. 1B.

First, a semiconductor substrate 202 is prepared on which two Hall elements 203a and 203b are formed through a silicon semiconductor manufacturing process (not shown).

The Hall elements 203a and 203b each have a size of 30 µm. The protective layer 204 is then formed from an insulator on the surface where the Hall elements 203a and 203b are formed, through a protective layer forming step illustrated in FIG. 2A. The protective layer 204 can be a single insulating inorganic compound film such as an oxide film or a nitride film, or a single organic film such as a polyimide film, or a combination of the films given here as an example. The protective layer 204 in this embodiment is an insulating inorganic compound film that has a polyimide film as the topmost layer in order to improve reliability.

Figure 2A:
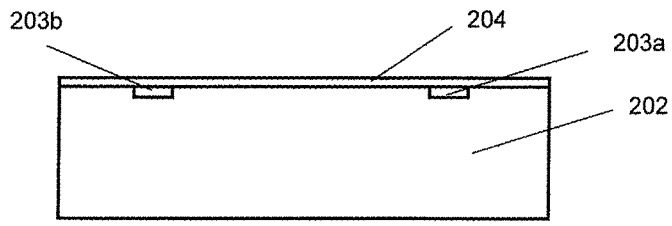
FIG. 2A, FIG. 2B, FIG. 2C, and FIG. 2D are vertical cross-sectional views for illustrating a protective layer forming step, a non-magnetic thin film forming step, and a resist layer forming step out of manufacturing steps of the semiconductor device according to the embodiment of the present invention.
Figure 2B:
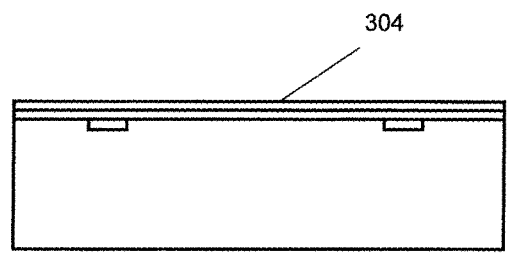

FIG. 2B is a diagram for illustrating a non-magnetic thin film forming step in which a conductive film 304 is formed on a surface of the protective layer 204 which is a formed on the surface of the semiconductor substrate 202. A copper film is formed as the conductive film 304 by sputtering to a thickness of 500 nm.

Figure 2C:
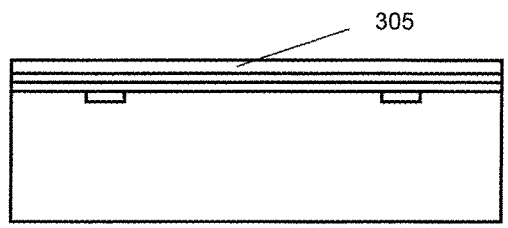
Figure 2D:
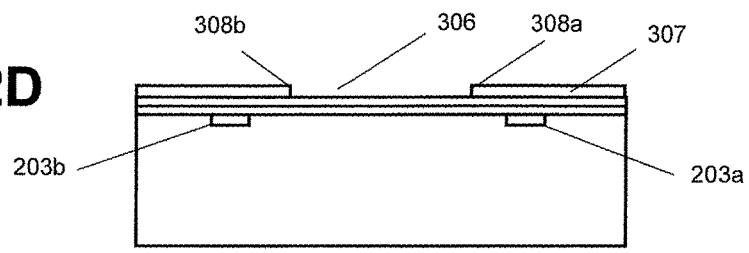

FIG. 2C and FIG. 2D are diagrams for illustrating a resist layer forming step in which a resist layer having a desired opening is formed by photolithography. In this step, a surface of the conductive film 304, which is a part of the current surface of the semiconductor substrate 202, is coated with a photoresist 305 (FIG. 2C), and a plating resist layer 307 having a resist opening 306 is formed by exposure and development (FIG. 2D). The photoresist 305 can be a positive photoresist and a negative photoresist both, and can be a dry film photoresist or other film photoresists instead of a liquid photoresist. In this embodiment, the conductive film 304 is coated with a liquid positive photoresist with the use of a spin coater until the coat reaches a thickness of 3 µm. The resist opening 306 is formed so that the distance between a resist edge portion 308a and the Hall element 203a and the distance between a resist edge portion 308b and the Hall element 203b are each 5 µm on the resist opening 306 side.

Figure 3A:
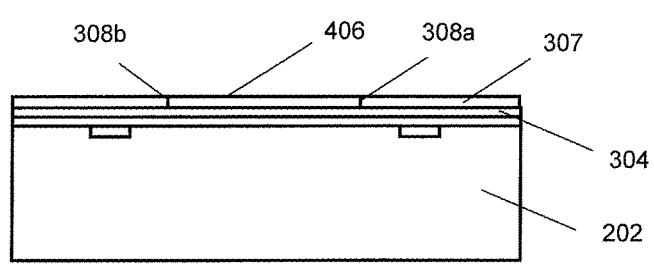
FIG. 3A and FIG. 3B are vertical cross-sectional views for illustrating a non-magnetic plating deposit structure forming step out of manufacturing steps of the semiconductor device according to the embodiment of the present invention.
Figure 3B:
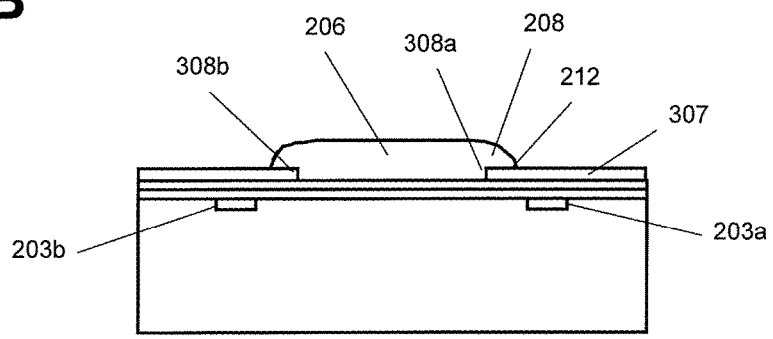

FIG. 3A and FIG. 3B are diagrams for illustrating a non-magnetic plating deposit structure forming step in which a structure is formed from a non-magnetic substance by wet plating. FIG. 3A and FIG. 3B are illustrations of the process of growth of a plating deposit structure. This embodiment deals with an example in which the plating deposit structure is a copper structure that is formed by precipitating a copper sulfate plating solution.

In FIG. 3A, an electric current is applied through the conductive film 304 in the copper plating solution (not shown), thereby causing the precipitation of a copper plating deposit 406 from a surface that is exposed in the resist opening 306. The thickness of the deposit reaches 3 µm, which is the thickness of the resist layer, with the result that the resist opening 306 is completely filled up with the copper plating deposit 406.

Plating conditions are generally set so that the electric current value is constant per unit plating region, in other words, the electric current density is constant. This makes the composition of the deposit and the deposition rate constant.

A copper plating condition that is preferred for the step of FIG. 3A, where the area of plating is constant, is then to use a constant electric current. The constant electric current value is calculated by multiplying an electric current density optimum for copper plating by the area of the resist opening 306.

In FIG. 3B, the electric current is applied further and the copper plating deposit, once reaching the resist edge portions 308a and 308b, starts growing in an isotropic manner in a direction perpendicular to the surface of the semiconductor substrate 202 and in a direction parallel to the surface of the semiconductor substrate 202. When the copper plating deposit grows 3 µm since the start of this stretch of growth, in other words, when the total thickness of the deposit reaches 6 µm, copper plating is ended. In this way, the forming of the non-magnetic structure 206, which is a copper plating deposit having the approximate quadrant portion 208, is complete. The edge portion 212 of the non-magnetic structure 206 is located at 2 µm from a point right above one edge of each of the Hall elements 203a and 203b.

In the region illustrated in FIG. 3B, the surface area increases as the plating progresses. When the growth of the plating deposit from the edge portion 308a is considered as a quadrant shape, the length of the rim of the resist opening 306 is given as L, the radius of the quadrant shape is given as R, and the increment in area is given as $S_2$, $S_2$ is calculated from the surface area of the quadrant shape along the rim length L and from the fact that the four corner portions of the oblong each have a quarter-hemisphere shape as follows:

$$S_2 = 2 \times \Pi \times R/4 \times L + 4 \times \Pi \times R^2/2/4 \times 4$$
$$= \Pi \times R \times L/2 + 2 \times \Pi \times R^2.$$

When the surface area of the resist opening 306 is given by $S_1$, the plating deposit area S is then expressed as follows:

$$S=S_1+S_2=S_1+\pi \times R \times L/2+2\times\pi\times R^2.$$

The radius R is a value determined by a growth time t and an electric current density $I_d$ (a growth rate V is in proportion to the electric current density).

Specifically, when the proportionality constant is given as k and the length of time passed since the plating deposit grows past the resist edge portions 308a and 308b is given as $t_2$, V is expressed as $V=k \times I_d$ and R is expressed as $R=V \times t=k \times I_d \times t_2$. When an electric current at the time $t_2$ is expressed by $I(t_2)$, the electric current value $I(t_2)$ is then calculated as follows:

$$I(t_2) = I_d \times S$$
$$= I_d \times (S_1 + \Pi \times R \times L/2 + 2 \times \Pi \times R^2)$$
$$= I_d \times (S_1 + \Pi \times (k \times I_d \times t_2 \times L)/2 + 2 \times \Pi \times (k \times I_d \times t_2)^2).$$

Stable plating is accomplished by changing the plating electric current value as calculated by this formula.

The electric current density in copper plating is 15 mA/cm² in this embodiment. The growth rate in this case is 0.33 µm/min and, with the total thickness of the copper plating deposit set to 6 µm, the plating time is 18 minutes.

Figure 4:
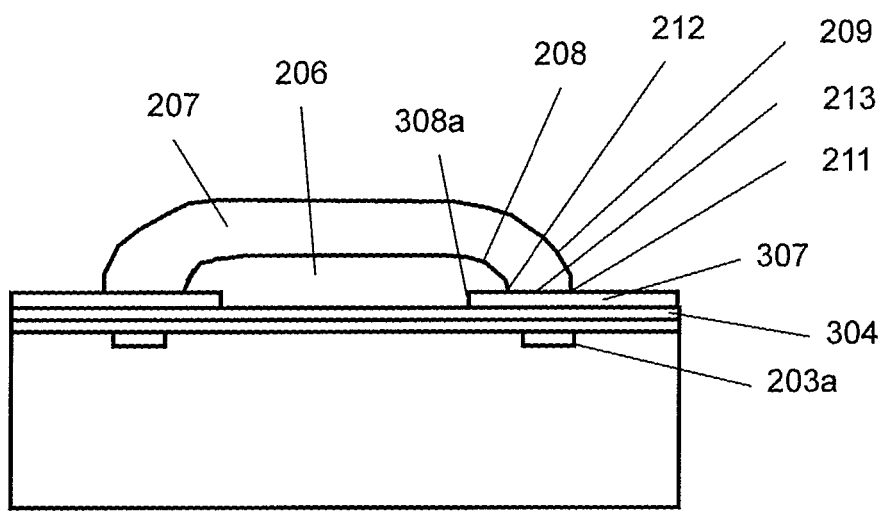
FIG. 4 is a vertical cross-sectional view for illustrating a magnetic plating deposit forming step out of manufacturing steps of the semiconductor device according to the embodiment of the present invention.

FIG. 4 is a diagram for illustrating a magnetic plating deposit forming step. In FIG. 4, the magnetic body 207 is formed on a surface of the non-magnetic structure 206, which is formed of a copper plating deposit. The shape and structure of the magnetic body 207 include the approximate quadrant portion 209 and the magnetic plating deposit edge portion 211. The approximate quadrant portion 209 is a part of the magnetic body 207 and is concentric with the approximate quadrant portion 208, which is a part of the non-magnetic structure 206 formed of a copper plating deposit. The edge portion 211 is an extension of the edge portion 212 of the non-magnetic structure 206 which extends from the resist opening edge portion 308a. The bottom portion 213 stretches from the edge portion 308a to the edge portion 211 through the edge portion 212, and is parallel to the surface of the Hall element 203a. A portion of the bottom portion 213 that belongs to the magnetic body 207 has a positional relationship that allows this portion to cover the Hall element 203a. Specifically, the magnetic body 207 is set so that the thickness of the plating deposit is 34 µm, and the portion of the bottom portion 213 that belongs to the magnetic body 207 protrudes from the left and right edges of the Hall element 203a, which has a length of 30 µm, by 2 µm on the left side and the right side each.

A plating method for the magnetic body 207 that is formed in this manner is described. The magnetic body plating solution used here contains nickel sulfamate in a metal concentration of 50 g/l and ferrous sulfamate in a metal concentration of 5 g/l, also contains boric acid as a pH adjuster, and further contains a water-soluble organic material as a brightening agent.

An electric current is applied via the conductive film 304 to the surface of the non-magnetic structure 206 illustrated in FIG. 3B which is a copper plating deposit, to thereby precipitate from the plating solution an alloy of nickel and iron that contains 20 wt % of iron. The iron content can be controlled by the ratio of the nickel ion concentration and the ferrous ion concentration in the plating solution, and by the value of the electric current density during electroplating. In this embodiment, each ion concentration and the electric current density are kept constant so that the composition of the magnetic plating deposit, which is a deposit of nickel and iron, is stabilized. The electric current value is set on the assumption that the quadrant shape grows in the manner described above as in the growth of the copper plating deposit, and is changed with a change in surface area. An optimum condition for this nickel-iron alloy plating is to set the electric current density to 20 mA/cm$^2$. In this case, the plating deposit grows at a rate of approximately 0.4 µm/min, and takes 85 minutes to reach a total thickness of 34 µm.

Figure 5A:
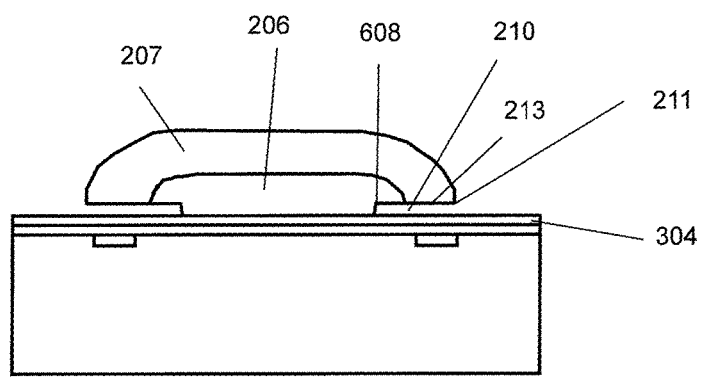
FIG. 5A and FIG. 5B are vertical cross-sectional views for illustrating a resist layer removing step and a conductive film etching step out of manufacturing steps of the semiconductor device according to the embodiment of the present invention.
Figure 5B:
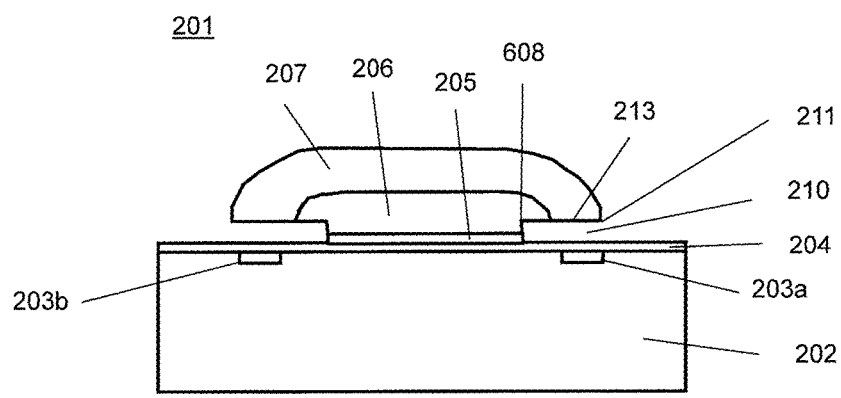

FIG. 5A is a diagram for illustrating a resist layer removing step, and FIG. 5B is a diagram for illustrating a conductive film etching step.

In the resist layer removing step, the resist layer 307 formed of a positive photoresist is removed by a special peeling solution. This removes the resist layer 307 and simultaneously forms a gap 210, which has the same thickness as that of the resist layer 307 at 3 µm, between the conductive film 304 and the bottom portion 213, which is formed from the edge portion 211 of the magnetic body 207 and an inner edge portion 608 of the non-magnetic structure 206 formed of a copper plating deposit.

In the conductive film etching step of FIG. 5B, a portion of the conductive film 304 illustrated in FIG. 5A that is exposed on the surface and a portion of the conductive film 304 that serves as the bottom of the gap 210 are removed by wet etching. The wet etching solution used here is an aqueous ammonium persulfate solution having the pH adjusted to 12 or so by adding ammonia water.

Through this step, the conductive film 304 is removed by etching from under the bottom portion 213, which stretches from the edge portion 211 of the magnetic body 207 to the inner edge portion 608 of the non-magnetic structure 206 formed of a copper plating deposit, in addition to the superficial portion of the conductive film 304 that is exposed on the protective layer 204 formed on the surface of the semiconductor substrate 202. Only a portion of the conductive film 304 that serves as the base layer 205 remains as a result.

The base layer 205, the non-magnetic structure 206, and the magnetic body 207 are thus kept from a direct contact with the Hall elements 203a and 203b embedded in the surface of the semiconductor substrate 202, by the gap 210 formed between the protective layer 204, which is on the Hall elements 20a and 203b, and the base layer 205, the non-magnetic structure 206, and the magnetic body 207.

The semiconductor device 201 completed in this manner is the same as the semiconductor device 201 illustrated in FIG. 1A and FIG. 1B, with the bottom portion 213 being parallel to the surfaces of the Hall elements 203a and 203b and having a positional relationship and a size that allow the bottom portion 213 to cover the Hall elements 203a and 203b completely in a top view.

The semiconductor device 201 fabricated as described above is installed with the magnetic body 207 shaped approximately like a letter U both on the outer side and the inner side in vertical cross-section, which means that the semiconductor device is installed with Hall elements having excellent magnetic flux converging performance. Specifically, magnetic fluxes passing near the semiconductor device 201 are converged by the approximately U-shaped magnetic body 207, which contains 80 wt % of nickel and 20 wt % of iron and which has excellent magnetic flux converging performance, and are input to and output from the Hall elements 203a and 203b, which are embedded in the surface of the semiconductor substrate 202, vertically to the Hall elements 203a and 203b in the bottom portion 213. This makes outputs from the Hall elements 203a and 203b very high, and improves the sensitivity of the semiconductor device 201 to magnetic fields strikingly.

In this embodiment, where a pair of Hall elements 203a and 203b are arranged symmetrically with respect to the magnetic body 207, the magnetic flux in a direction parallel to the semiconductor device 201, namely, a direction parallel to the Hall elements 203a and 203b, is changed by the magnetic body 207 so as to be input to and output from the Hall elements 203a and 203b in a direction perpendicular to the Hall elements 203a and 203b. The direction of the input/output is opposite in the Hall element 203a and in the Hall element 203b, which means that a magnetic field component in a direction parallel to the semiconductor device 201 can be calculated by calculating a difference between the output from the hall element 203a and the output from the Hall element 203b.

The magnetic flux in a direction perpendicular to the semiconductor device 201, namely, a direction perpendicular to the Hall elements 203a and 203b, passes through the magnetic body 207 without changing direction, and enters and exits the Hall elements 203a and 203b in its original direction. The direction of the entrance/exit is the same in the Hall element 203a and in the Hall element 203b, which means that a magnetic field component in a direction perpendicular to the semiconductor device 201 can be calculated by calculating the sum of the output from the hall element 203a and the output from the Hall element 203b.

In addition, in the semiconductor device 201, since the base layer 205 lies inside a region defined by the Hall elements 203a and 203b and since the base layer 205, the non-magnetic structure 206, and the magnetic body 207 don't have a direct contact with the top surfaces of the Hall elements 203a and 203b through the protective layer 204, the Hall elements 203a and 203b don't receive residual stress from the base layer 205, the non-magnetic structure 206, and the magnetic body 207, stress from heat, and other types of stress, thereby significantly reducing the influence of the piezoelectric effect, noise, and the like and, at the same time, effectively preventing damage to the Hall elements 203a and 203b from a mechanical impact or other causes.

The semiconductor device according to this embodiment is installed with a magnetic body that has a substantially letter U shape in vertical cross-section, has edge bottom portions of the U-shape portion in parallel to the Hall elements, and has bottom portions located above the Hall elements. It is thus concluded from above that this semiconductor device is capable of dividing a magnetic field that is from outside the semiconductor device into a component parallel to the semiconductor device and a component perpendicular to the semiconductor device, and outputting the result with high sensitivity, and at the same time, is excellent in reliability and stability.

While this embodiment discusses a case of forming two Hall elements 203a and 203b, it goes without saying that the same effect is obtained when more than two Hall elements are formed in order to enhance magnetic field directionality and sensitivity to magnetic fields.

The bottom portion 213 in the semiconductor device 201 of this embodiment has a surface parallel to the surfaces of the Hall elements 203a and 203b, and has a positional relationship and a size that allow the bottom portion 213 to cover the Hall elements 203a and 203b completely. However, the sizes and positional relationships of the non-magnetic structure and the magnetic body relative to the Hall elements are to be selected to suit the purpose of use of the semiconductor device.

Figure 6A:
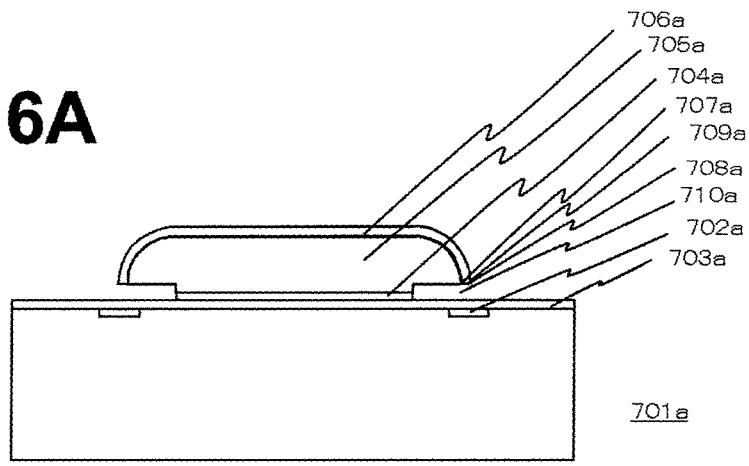
FIG. 6A, FIG. 6B, and FIG. 6C are vertical cross-sectional views for illustrating another mode of the semiconductor device according to the embodiment of the present invention.
Figure 6B:
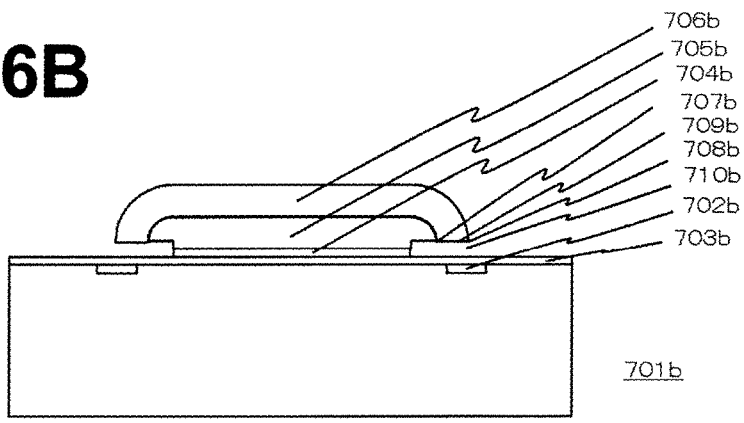
Figure 6C:
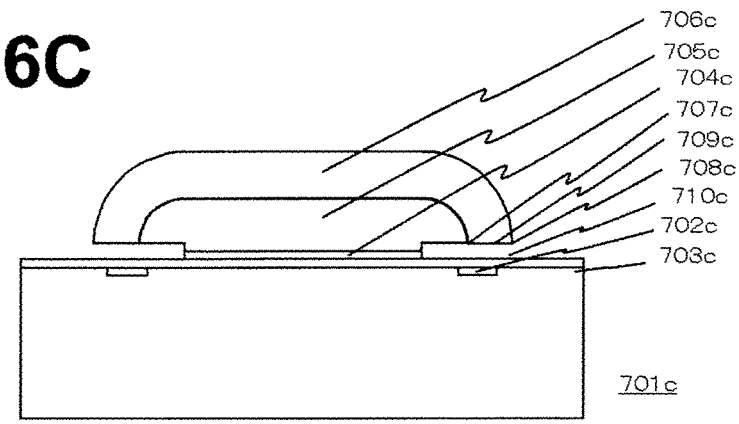

For instance, the same effect as in this embodiment can be expected when a bottom portion 709a of a magnetic body 706a is smaller than the surface of a Hall element 703a as illustrated in FIG. 6A, when only the outer circumferential side of a bottom portion 709b of a magnetic body 706b covers a Hall element 703b as illustrated in FIG. 6B, and when only the inner circumferential side of a bottom portion 709c of a magnetic body 706c covers a Hall element 703c as illustrated in FIG. 6C.

Figure 7A:
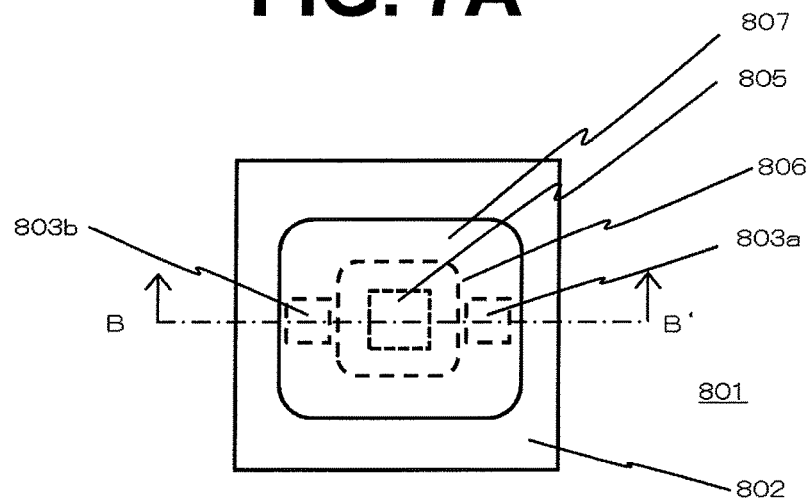
FIG. 7A and FIG. 7B are vertical cross-sectional views for illustrating still another mode of the semiconductor device according to the embodiment of the present invention.
Figure 7B:
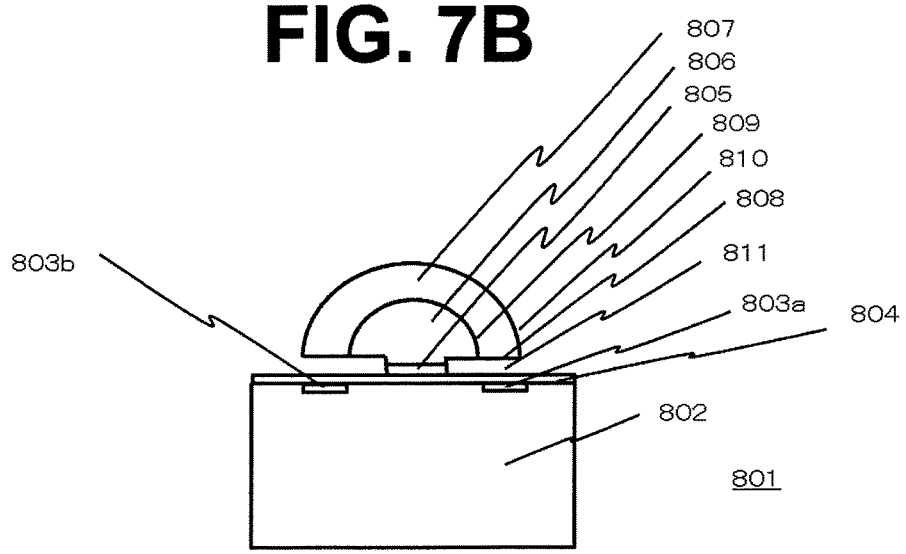
Figure 8A:
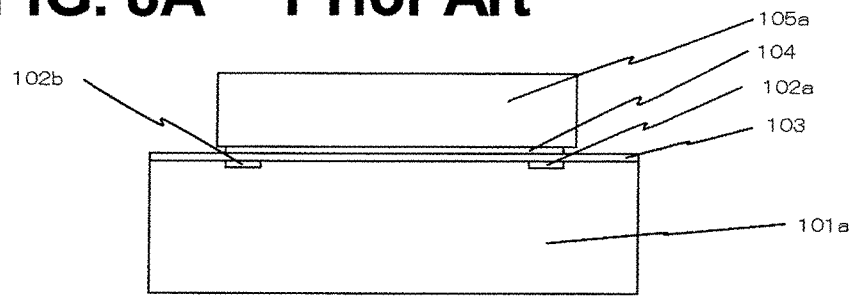
FIG. 8A, FIG. 8B, and FIG. 8C are vertical cross-sectional views of a main portion of a semiconductor device of the related art in which a magnetic body is installed.
Figure 8B:
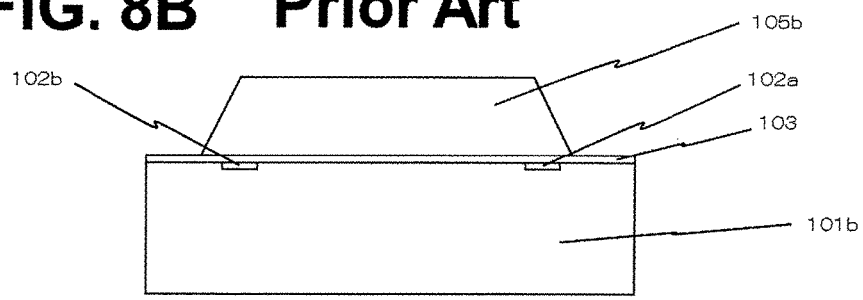
Figure 8C:
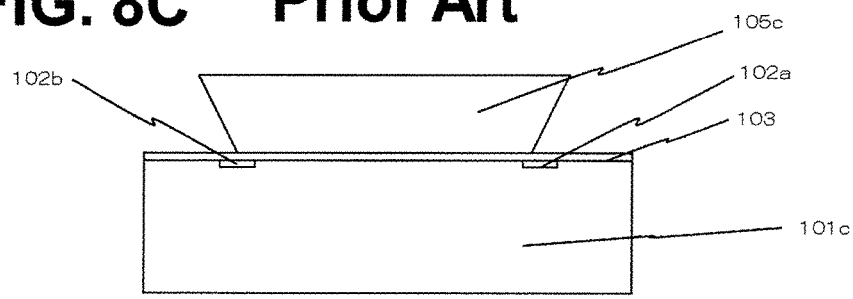

As in a semiconductor device 801 formed on a semiconductor substrate 802 which is illustrated in FIG. 7A and FIG. 7B, when the distance between Hall elements 803a and 803b is small and a base layer 805 formed on the surface of a protective layer 804 is accordingly small relative to a non-magnetic structure 806 and a magnetic body 807, a curved portion 809 of the non-magnetic body 806 is curved along the entire outer circumference, and a curved portion 810 of the magnetic body 807 can also be curved along the entire outer circumference that defines the contour in vertical-cross section of the magnetic body 807. In this case, the shape of the curve can be changed relatively freely by choosing a suitable brightening agent and other contents of the copper plating solution, which is very effective in the downsizing of the semiconductor device 801 and the Hall elements 803a and 803b.

The semiconductor device according to the present invention may be molded or sealed with resin or the like when installed or packaged. The gaps between the bottom portions of the magnetic body overhang portions and the Hall element surface may be filled with resin in this case. However, this does not affect the essence of the semiconductor device according to the present invention, and this mode is obviously included in the present invention.

What is claimed is:

1. A semiconductor device, comprising:
   a semiconductor substrate having a plurality of Hall elements formed therein;
   a base layer formed on the semiconductor substrate and disposed inside a region defined by the Hall elements so as not to overlap the Hall elements;
   a magnetic body formed on the base layer and having a magnetic flux converging function, the magnetic body having a contour in a vertical cross-section that is defined by an outer circumferential portion, at least a part of the outer circumferential portion comprises a curve-shaped portion and a portion substantially parallel to the semiconductor substrate;
   a structure made of non-magnetic substance at least a part of which is embedded in the magnetic body, the non-magnetic structure being entirely above the entirety of the base layer; and
   a gap formed between the semiconductor substrate and the portion substantially parallel to the semiconductor substrate, and lying above whole tops of the Hall elements.

2. The semiconductor device according to claim 1, wherein the gap separates the region of the plurality of Hall elements and the magnetic body.

3. The semiconductor device according to claim 1, wherein the portion substantially parallel covers an entirety of the region of the plurality of Hall elements.

4. The semiconductor device according to claim 1, wherein the curve-shaped portion has an approximate quadrant shape.

5. The semiconductor device according to claim 1, wherein at least a part of the structure made of the non-magnetic substance comprises, in the vertical cross-section, a curve-shaped portion on a surface that is in contact with the magnetic body.

6. The semiconductor device according to claim 1, wherein at least a part of the magnetic body and at least a part of the structure made of the non-magnetic substance each comprise, in the same vertical cross-section, an approximate quadrant shape, and the approximate quadrant shape of the magnetic body and the approximate quadrant shape of the structure are substantially concentric with each other.

7. The semiconductor device according to claim 1, wherein the magnetic body is formed from a magnetic material that contains at least one of nickel, cobalt, and iron.

8. The semiconductor device according to claim 1, wherein the non-magnetic substance comprises metal that comprises one of copper and gold as a main component.

9. A semiconductor device, comprising:
   a semiconductor substrate having a surface in which are formed a plurality of spaced-apart Hall elements;
   a base layer formed on the semiconductor substrate and disposed inside a region defined by the Hall elements so as not to overlap the Hall elements;
   a magnetic body disposed on the base layer and having a magnetic flux converging function, the magnetic body having an outer circumferential surface which has a curve-shaped portion and a portion substantially parallel to the semiconductor substrate surface, the portion substantially parallel to the semiconductor substrate surface being spaced from and completely overlying top surfaces of the Hall elements; and
   a structure made of a non-magnetic substance at least a part of which is embedded in the magnetic body, the non-magnetic structure being entirely above the entirety of the base layer.

10. The semiconductor device according to claim 9; wherein the curve-shaped portion has an approximate quadrant shape.

11. The semiconductor device according to claim 9; wherein at least a part of the structure made of the non-magnetic substance comprises a curve-shaped portion on a surface that is in contact with the magnetic body.

12. The semiconductor device according to claim 9; wherein at least a part of the magnetic body and at least a part of the structure made of the non-magnetic substance each comprise, in a same vertical cross-section, an approximate quadrant shape, and the approximate quadrant shape of the magnetic body and the approximate quadrant shape of the structure are substantially concentric with each other.

13. The semiconductor device according to claim 9; wherein the magnetic body is formed from a magnetic material that contains at least one of nickel, cobalt, and iron.

14. The semiconductor device according to claim 9; wherein the non-magnetic substance comprises metal that comprises one of copper and gold as a main component.

\* \* \* \* \*